United States Patent [19]

Matsunaga

[11] Patent Number: 4,984,045
[45] Date of Patent: Jan. 8, 1991

[54] OUTPUT SENSOR OF CHARGE TRANSFER DEVICE

[75] Inventor: Yoshiyuki Matsunaga, Kamakura, Japan

[73] Assignee: Kabushiki Kaisha Toshiba, Kawasaki, Japan

[21] Appl. No.: 218,291

[22] Filed: Jul. 12, 1988

[30] Foreign Application Priority Data

Jul. 13, 1987 [JP] Japan .................. 62-174120

[51] Int. Cl.⁵ .............. H01L 29/78; H01L 29/10; H01L 29/68
[52] U.S. Cl. ................ 357/24; 357/23.4; 357/23.5; 357/23.12
[58] Field of Search .............. 357/24, 24 M, 24 LR, 357/23.1, 23.4, 23.12, 23.5

[56] References Cited

U.S. PATENT DOCUMENTS 4,262,217 4/1981 Levine ................. 357/24 M
4,280,068 6/1981 Snijder ................ 357/24 M

FOREIGN PATENT DOCUMENTS 0055067 3/1984 Japan .................. 357/24

OTHER PUBLICATIONS

Philips Res. Lab (Redhill) An. Rev. (6B) 1978 pp. 17-18 R. J. Brewer.
Charge Transfer Devices, Academic Press Inc. Sequin and Tompsett 1975 pp. 47-61.
Solid-State Electronics, vol. 23, pp. 747-753 Pergamon Press, 1980; Chakravarti and Das.
IEEE Int. Electronics Device Meeting Tech. dig. pp. 610-612; R. J. Brewer; 1978.

Primary Examiner—Andrew J. James
Assistant Examiner—Ngan V. Ngo
Attorney, Agent, or Firm—Oblon, Spivak, McClelland, Maier & Neustadt

[57] ABSTRACT

An output sensor of a charge transfer device includes a well region of a second conductivity type having a low impurity concentration and formed in the surface area of a semiconductor substrate of a first conductivity type. A charge-sensing buried channel region of the first conductivity type is formed in part of the surface area of the well region, and a gate electrode is formed on the charge-sensing buried channel region via a gate insulation film. Further, source and drain regions of the second conductivity type are disposed on both sides of the charge-sensing buried channel region in a width direction thereof to constituted a charge-sensing MOS transistor. The charge-sensing buried channel region is formed continuously with a charge-transfer buried channel region buried in the well region.

7 Claims, 6 Drawing Sheets

OUTPUT SENSOR OF CHARGE TRANSFER DEVICE

BACKGROUND OF THE INVENTION

1. Field of the Invention

This invention relates to an output sensor of a charge transfer device such as a CCD sensor.

2. Description of the Related Art

As a typical example of an output sensor of a charge transfer device such as a CCD sensor, an output sensor with a floating diffusion layer, named as a "floating diffusion amplifier", is known, as is disclosed in "High-Resolution 8 mm CCD Image Sensor with Correlated Clamp Sample and Hold Charge Detection Circuit", IE[3] Transaction on Electron Device, Vol. ED-33, No. 6, June 1986. The floating diffusion layer is provided at the succeeding stage of the output gate of a charge transfer stage, and a wiring layer derived out from the floating diffusion layer is connected to a source follower circuit, for example. When a signal charge is transferred into the floating diffusion layer through the output gate, the potential thereof is changed, and the potential variation is converted into a signal voltage and supplied as an output signal voltage by means of the source follower circuit. After the signal charge of the floating diffusion layer is sensed, it is drained or discharged into the reset drain by turning ON the reset gate.

The sensitivity of the output sensor using the floating diffusion layer is determined by the parasitic capacitance associated with the floating diffusion layer. If the parasitic capacitance is large, the potential variation due to the signal charge becomes small so that the sensitivity will be set small the parasitic capacitance associated with the floating diffusion layer includes a junction capacitance inherent to the floating diffusion layer, a capacitance of the output wiring layer connected to the floating diffusion layer and an input gate capacitance of the source follower circuit connected to the output wiring layer. In general, the junction capacitance inherent to the floating diffusion layer is the largest one of these capacitances. Therefore, in order to attain a high sensitivity, it is desirable to suppress the area of the floating diffusion layer to a minimum. However, it is necessary to form a contact hole in the floating diffusion layer for connection between the output wiring layer and the floating diffusion layer and provide a sufficient space between the floating diffusion layer and each of the output gate and reset gate arranged on both sides thereof, the area of the floating diffusion layer cannot be freely reduced. For this reason, it is difficult to attain the high sensitivity in the signal charge sensor utilizing the floating diffusion layer.

An output sensing device which can be used instead of the output sensing device using the floating diffusion layer is proposed (IEEE Transactions on Electron Devices, vol. ED-27, No. 2, Feb. 1980). In the proposed output sensing device, an output sensor is formed of a MOS transistor having a surface channel region which has a conductivity type opposite to that of the buried channel region of a CCD, which is formed in the surface area of the buried channel region and which extends in a direction perpendicular to the charge transfer direction of the buried channel region. In a case where the output sensing device is used in an n-type buried channel CCD, a surface channel type p-channel MOS transistor is formed which has source and drain regions formed on both sides of the buried channel at the succeeding stage of the output gate of the buried channel. When a signal charge transferred via the buried channel is further transferred to under the surface channel region of the charge sensing MOS transistor via the output gate, the MOS transistor is substantially applied with a substrate bias voltage, modulating the conductivity of the surface channel region. In this way, the signal charge can be converted into current and externally supplied as a current output signal. In the output sensing device, the capacitance of the output section can be sufficiently reduced and the signal charge can be sensed with a high sensitivity in comparison with the output sensing device using the floating diffusion layer.

However, in this type of output sensing device, it is necessary to solve some problems in order to sense a minute signal charge with a high sensitivity. Since, in the signal charge sensing MOS transistor used in this output sensing device, the surface area of the buried channel region is used as a channel and the internal portion thereof into which the signal charge is injected is used as a gate electrode, the pn junction between the buried channel region and the substrate has a large input capacitance. Further, a large capacitance is also provided between the gate electrode and the buried channel region.

Thus, in the conventional output sensing device described above, it is still difficult to sense a minute signal charge with a high sensitivity.

SUMMARY OF THE INVENTION

An object of this invention is to solve the above problems and provide an output sensor of a charge transfer device with a high sensitivity.

This object can be attained by an output sensor of a charge transfer device comprising a semiconductor substrate of a first conductivity type; a well region of a second conductivity type having a low impurity concentration and formed in the surface area of the semiconductor substrate; a charge-sensing buried channel region of the first conductivity type formed in part of the surface area of the well region, part of the well region which lies under the channel region being set in the depletion state; at least one gate electrode formed on the charge-sensing buried channel region via a gate insulation film; and source and drain regions of the second conductivity type disposed on both sides of the charge-sensing buried channel region in a width direction thereof.

In the output sensor of the charge transfer device with the construction as described above, the low impurity concentration well region of the second conductivity type is formed in the surface area of the semiconductor substrate of the first conductivity type so that a capacitance between the charge-sensing buried channel region and the semiconductor substrate can be reduced. Further, in the CCD structure having the low impurity concentration well region of the first conductivity type formed on the semiconductor substrate of the second conductivity type, the gate capacitance of the charge-sensing MOS transistor can be reduced. In this way, the signal charge sensing operation can be effected with a high sensitivity.

DETAILED DESCRIPTION OF THE PREFERRED EMBODIMENTS

There will now be described an embodiment of this invention with reference to the accompanying drawings.

Figure 1:
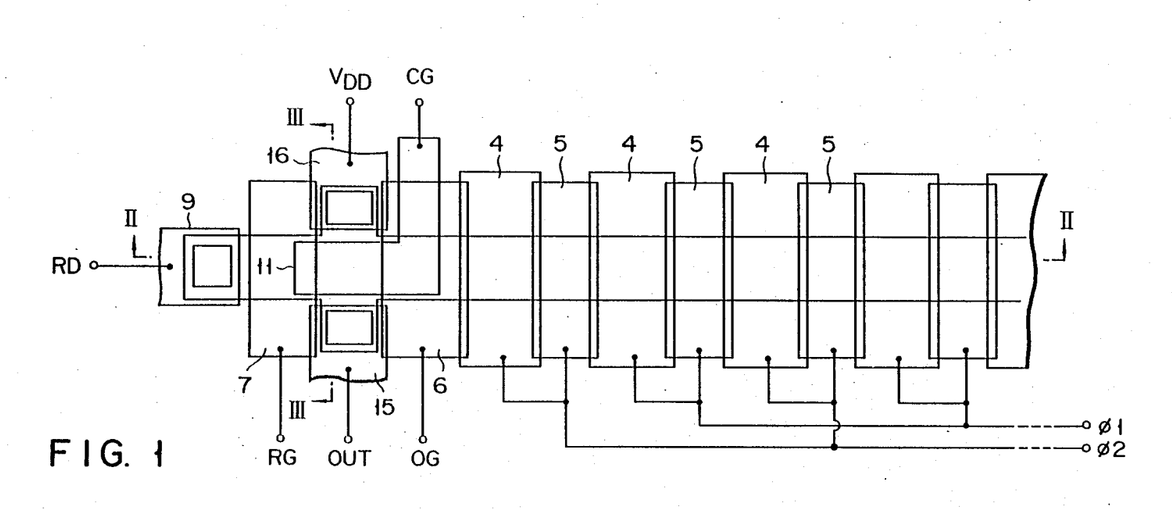
FIG. 1 is a plan view of a charge transfer device and an output sensor thereof according to an embodiment of this invention.
Figure 2:
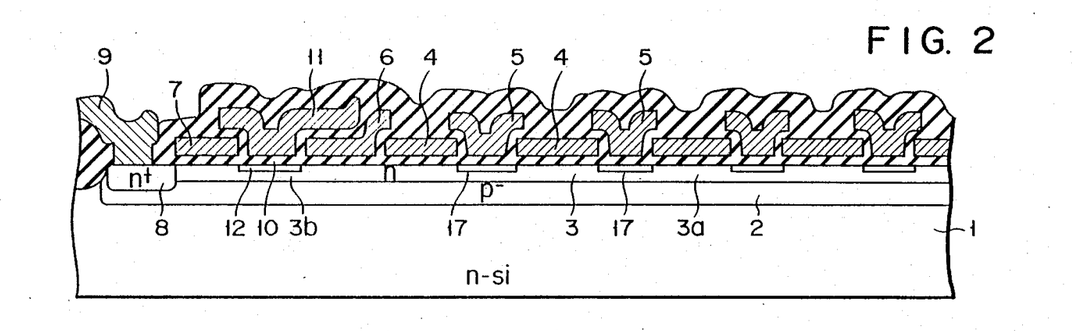
FIG. 2 is a cross sectional view taken along line II—II of FIG. 1.

FIG. 1 is a plan view of a charge transfer device and an output sensor thereof according to an embodiment of this invention. As shown in FIG. 1, a two-phase driven type CCD is formed by use of n-type Si substrate 1, and the two-phase driven type CCD includes p-type well region 2 of low impurity concentration formed in an area which is isolated from the remaining portion of n-type substrate 1 and n-type buried channel region 3 formed in the surface area of p-type well region 2. The two-phase driven type CCD is the horizontal CCD section of an interline transfer type CCD image pick-up device, for example. As is well known in the art, the signal charge transfer section includes transfer gates 4 and 5 formed of first and second polysilicon films which are alternately arranged in one direction. Transfer gate 4 is used for charge storage and transfer gate 5 is used as a barrier electrode, and barrier regions 17 are formed by ion-implanting P-type impurity into those areas of channel region 3 which lie under transfer gates 5. Output gate 6 is arranged at the last stage of the transfer section and reset gate 7 is arranged at a predetermined distance from output gate 6. Buried channel region 3 is formed to extend into a portion under reset gate 7. Further, n+-type reset drain 8 connected to drain terminal 9 is formed at the succeeding stage of reset gate 7, and the signal charge transferred via buried channel region 3 is drained into reset drain 8.

A charge-sensing MOS transistor is formed between output gate 6 and reset gate 7. That is, buried channel region 3 can be divided into charge-transfer layer 3a and charge-sensing layer 3b with output gate 6 used as a boundary, gate electrode 11 is formed on insulation film 10 which in turn is formed on the surface area of charge-sensing layer 3b used as current channel region 12, and p-type source and drain regions 13 and 14 are formed on both sides of charge-sensing layer 3b, thus constituting the MOS transistor as is clearly seen in FIG. 3. Gate electrode 11 is formed of a polysilicon layer which is the third layer. Source and drain terminals 15 and 16 are respectively connected to source and drain regions 13 and 14 of the charge-sensing MOS transistor.

Figure 3:
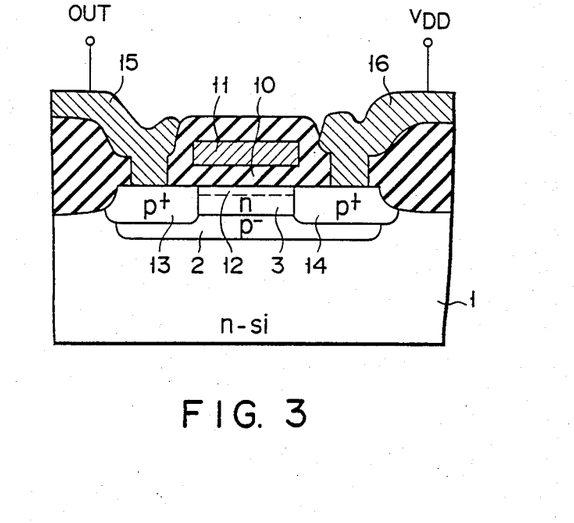
FIG. 3 is a cross sectional view taken along line III—III of FIG. 1.

In this charge-sensing MOS transistor, it is important that n-type charge-sensing layer 3b is formed in the surface area of p-type well region 2 of low impurity concentration so that substantially entire portion of p-type well region 2 lying under charge-sensing layer 3b can be set in the depleted stage. The condition can be satisfied by adequately setting the impurity concentration and the thickness of p-type well region 2 and n-type buried region 3. With this construction source and drain regions 13 and 14 of the MOS transistor can be isolated from each other. For example, p-type well region 2 located below layer 36 will be depleted completely if region 2 has a junction depth of 2.5 $\mu$m and a surface impurity concentration of $1 \times 10^{15}$ cm$^{-3}$, and if n-type buried region 3 has a junction depth of 0.5 $\mu$m and an impurity concentration of $2 \times 10^{16}$ cm$^{-3}$.

The operation of the CCD output section is as follows.

As is well known in the art, the signal charge is transferred via charge-transfer buried channel layer 3a by applying two-phase clock signals $\phi 1$ and $\phi 2$ shown in FIG. 1 to transfer gates 4 and 5. When output gate 6 is turned ON, the signal charge is transferred into buried channel layer 3b of the MOS transistor section. Due to the transfer of the signal charge into channel layer 3b, the conductivity of current channel region 12 of the MOS transistor is modified. As described before, this is based on the principle known as the substrate bias effect in an ordinary MOS transistor. Then, the signal charge can be sensed by detecting the conduction state between the source and drain regions.

Figure 4:
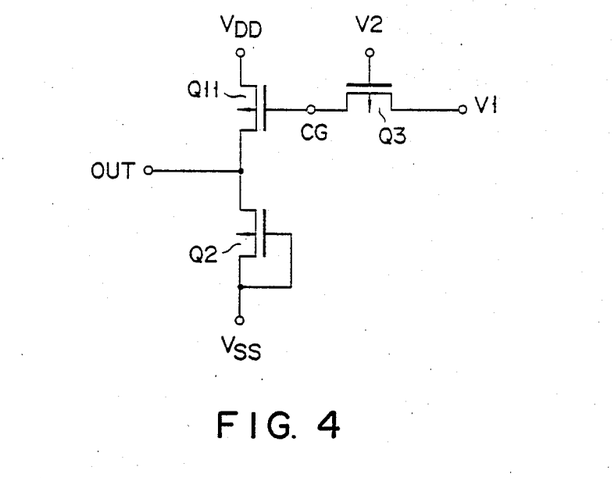
FIG. 4 is a view showing the construction of a sensing circuit including a charge-sensing MOS transistor.

FIG. 4 shows an equivalent circuit of a charge-sensing circuit. In FIG. 4, Q11 denotes the charge-sensing p-channel MOS transistor used as a driver, and p-channel MOS transistor Q2 is connected to the source of MOS transistor Q11 to constitute a source follower circuit. Gate electrode 11 of the charge-sensing MOS transistor or control terminal CG is connected to be set at a preset potential via MOS transistor Q3 serving as a switching element. That is, MOS transistor Q3 is turned ON to apply a preset D.C. potential to the gate of charge-sensing MOS transistor Q11 prior to the signal charge sensing operation. When the signal charge is transferred into the buried channel region of charge-sensing MOS transistor Q11, MOS transistor Q3 is turned OFF, thus setting the gate of charge-sensing MOS transistor Q11 in the electrically floating condition.

According to the embodiment, an extremely high sensitivity can be obtained in comparison with the charge-sensing system using the floating diffusion layer.

In this embodiment, n-type buried layer 3b functioning as the signal input gate of charge-sensing MOS transistor Q11 is formed in p-type well region 2 which is set in substantially the depleted state. Therefore, the input capacitance can be reduced and the high sensitivity can be attained in comparison with the case where an n-type buried channel region is simply formed in the p-type substrate and the surface area of the n-type buried channel region is used as a current channel of the charge-sensing MOS transistor. Further, as described with reference to FIG. 4, the capacitance of the gate electrode of charge-sensing MOS transistor Q11 can be reduced and the sensitivity can be further improved by setting the gate electrode in the electrically floating condition at the time of charge sensing operation. Since the p-type source and drain regions of charge-sensing MOS transistor Q11 are formed in p-type well region 2 of low impurity concentration which is set in substantially the depleted state, the capacitance associated therewith can also be reduced, making the charge sensing operation highly reliable. If current channel region 12 of charge-sensing MOS transistor Q11 is formed in the buried channel structure, 1/f noise caused by trap effect in the interface between the substrate and gate insulation film can be suppressed, enhancing the operation efficiency thereof. If a p-type impurity is ion-injected into the current channel region 12 of transistor Q11, region 12 will become a p-type region, and a buried channel region will be formed. Instead, a p-type impurity can be ion-injected into region 12, thereby forming an $n^{--}$-type region to achieve the same purpose.

Gate insulation film 10 of charge-sensing MOS transistor Q11 may formed with substantially the same thickness as that of the insulation film of the CCD transfer section, but can be formed thicker when it is required to reduce the gate capacitance.

Figure 5:
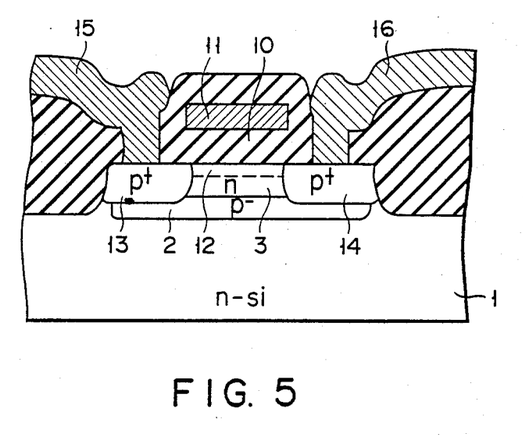
FIG. 5 is a cross sectional view showing the construction of the charge-sensing MOS transistor section in a charge transfer device and an output sensor of this invention.
Figure 6:
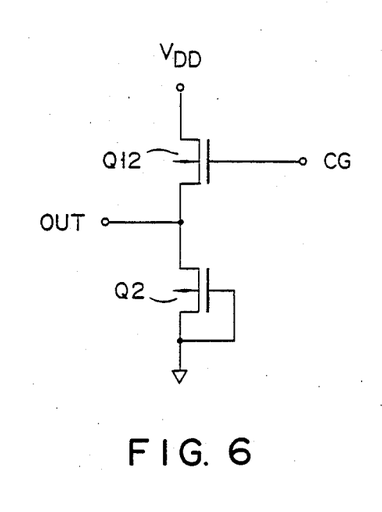
FIG. 6 is a view showing the construction of a sensing circuit including the charge-sensing MOS transistor section of FIG. 5.

FIG. 5 is a cross sectional view of a charge-sensing MOS transistor according to another embodiment of this invention. The charge-sensing MOS transistor of this embodiment is similar to that of FIG. 3 except that gate insulation film 10 is formed sufficiently thick. With this construction, since the gate capacitance can be reduced as described before, the sensing circuit can be formed as shown in FIG. 6 by omitting MOS transistor Q3 serving as the switching element shown in FIG. 4, and it is possible to apply a fixed D.C. bias potential to the gate of charge-sensing MOS transistor Q12. However, in this case, it is necessary to use a bias voltage higher than the bias voltage used in the formed embodiment.

Figure 7:
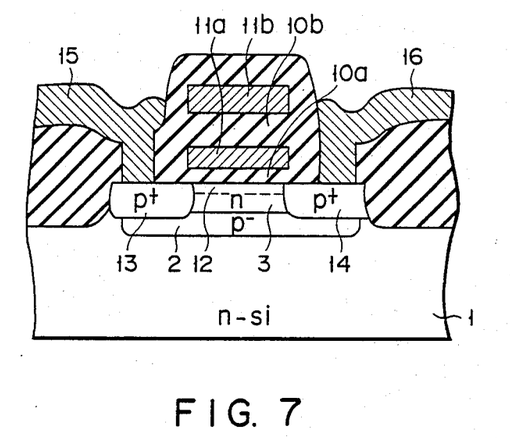
FIG. 7 is a cross sectional view showing the construction of a charge-sensing MOS transistor section according to another embodiment of this invention.
Figure 8:
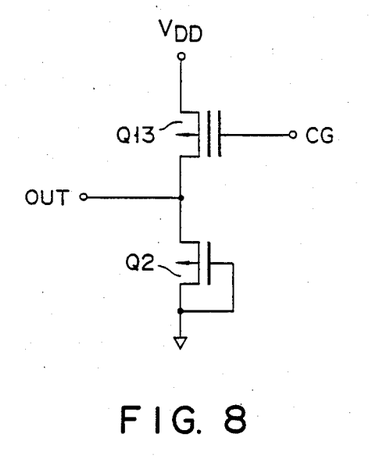
FIG. 8 is a view showing the construction of a sensing circuit including the charge-sensing MOS transistor section of FIG. 7.

FIG. 7 is a cross sectional view of a charge-sensing MOS transistor according to still another embodiment. In this embodiment, the gate section of the charge-sensing MOS transistor is constituted by forming floating gate electrode 11a on first gate insulation film 10a which is thin, and disposing control gate electrode 11b on floating gate electrode 11a via second gate insulation film 11b. The source follower circuit with the construction as described above functions as a sensing circuit, and in this case, a D.C. potential is applied to the control gate of charge-sensing MOS transistor Q13 as shown in FIG. 8.

With the above construction, the following advantages can be obtained. When gate insulation film 10 is formed thick as shown in the embodiment of FIG. 5, the potential distribution is buried channel region 3 is strongly influenced by the effect of output gate 6 and reset gate 7 adjacent to each other in a charge transfer direction and becomes non-uniform in the charge transfer direction. This is a phenomenon known as a two-dimensional effect, and may cause part of the signal charge to be left behind. According to this embodiment, floating gate electrode 11a is disposed in a shallow position of the gate insulation film in order to make the potential in the buried channel region uniform, so that the problem as described above can be solved. Further, even if first gate insulation film 10a lying under floating gate electrode 11a is formed thin, the gate capacitance will not increase because floating gate electrode 11a is set in the electrically floating condition.

In the embodiments described above, the charge-sensing MOS transistor is constituted to have the surface area of buried channel layer 3b used as current channel 12. In this case, it is preferable to form the current channel of the charge-sensing MOS transistor in the form of buried channel structure in order to improve the S/N ratio as described before. Even in this case, the current channel of the charge-sensing MOS transistor is positioned above the area of the charge-sensing buried channel region into which the signal charge is transferred. However, it is possible to form the current channel of the charge-sensing MOS transistor below the charge-sensing buried channel region.

Figure 9:
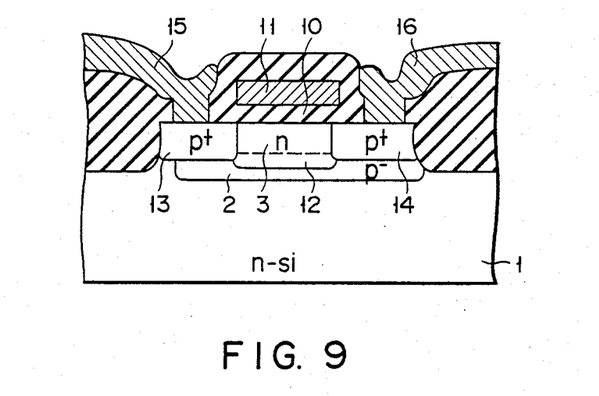
FIG. 9 is a cross sectional view showing the construction of a charge-sensing MOS transistor section according to still another embodiment of this invention.

FIG. 9 is cross sectional view showing the construction of a charge-sensing MOS transistor which satisfies the positional relation as described above. As is clearly understood when comparing FIGS. 1 and 9, current channel region 12 is formed below n-type buried channel region 3. For example, current channel region 12 is formed by ion-implanting p-type impurity into a deep area.

According to this embodiment, the S/N ratio can be further improved over the former embodiments. It is possible to form the deep current channel as in the embodiment of FIG. 9 in the gate structures of the embodiments shown in FIGS. 3 and 5.

In the embodiments described above, the p-type well region of low impurity concentration is formed in the n-type substrate and the n-type buried region is formed in the surface area of the well region. However, it is also possible to apply this invention to a CCD structure having an n-type buried region formed in a p-type substrate. Charge-sensing MOS transistor sections of such CCD structures according to other embodiments are shown in FIGS. 10 to 12.

Figure 10:
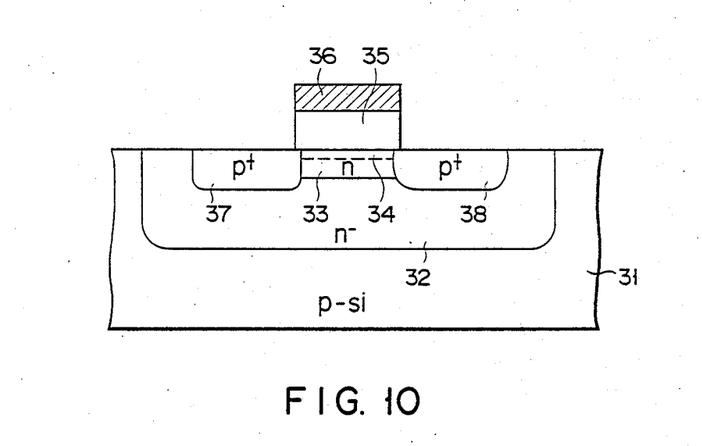
FIG. 10 is cross sectional view showing the construction of charge-sensing MOS transistor section according to other embodiment of this invention.

As shown in FIG. 10, charge-sensing channel region 33 is formed continuously with the n-type buried channel region of the CCD transfer section in p-type Si substrate 31, and the surface area of buried channel region 33 is used as current channel region 34. Gate electrode 36 is formed over current channel region 34 with gate insulation film 36 disposed therebetween. Further, n-type well region 32 of low impurity concentration is formed to surround buried channel region 33, and p-type source and drain regions 37 and 38 are formed in n-type well region 32.

In this embodiment, the charge sensing operation can be effected with high sensitivity. That is, in the embodiment in which n-type well region 32 of low impurity concentration is formed in the p-type substrate, the capacitance of n-type buried channel region 33 or the gate capacitance of the charge-sensing MOS transistor is made small. Further, if the thickness of the gate insulation film is increased to a certain extent and a preset potential is applied to gate electrode 36 via the switching element as shown in FIG. 4, the capacitance associated with the gate electrode can be reduced to a sufficiently small value.

Figure 11:
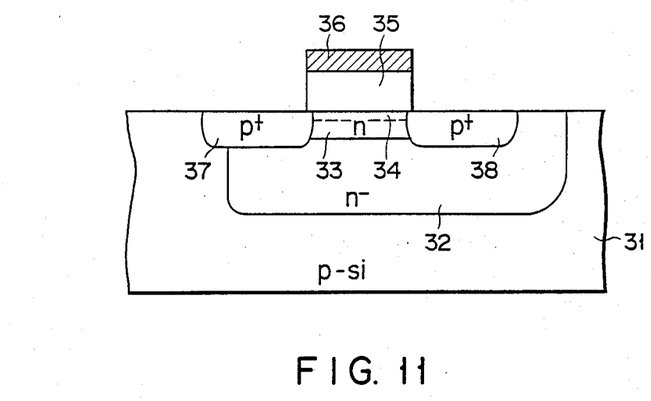
FIG. 11 is cross sectional view showing the construction of charge-sensing MOS transistor sections according to other embodiment of this invention.
Figure 12:
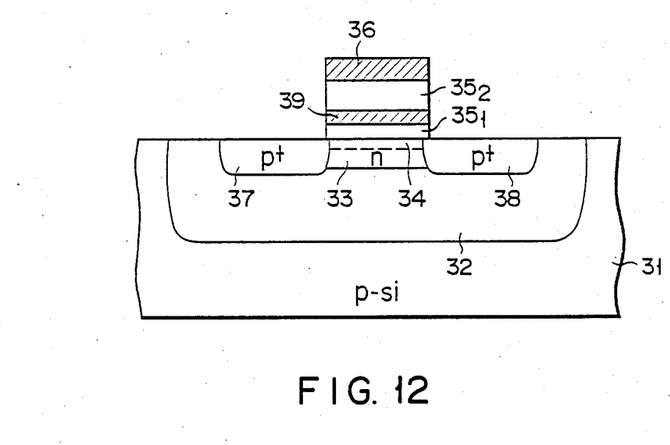
FIG. 12 is cross sectional view showing the constructions of charge-sensing MOS transistor sections according to other embodiments of this invention.

FIG. 11 shows the case where part of source region 37 is formed to extend out of n-type well region 32 in the semiconductor structure of FIG. 10. FIG. 12 shows the case where the gate section is formed of a laminated structure of floating electrode 39 and control gate 36 in the semiconductor structure of FIG. 10. In these embodiments, the high sensitivity can be attained as in the former embodiments.

This invention is not limited to the embodiments described above, and can be variously modified. For example, the output sensor of this invention can be applied not only to the CCD image pick-up devices but also to various other CCD devices and charge transfer devices such as BBD.

What is claimed is:

1. An output sensor of a charge transfer device comprising:
   a semiconductor substrate of a first conductivity type;
   a well region of a second conductivity type having a low impurity concentration and formed in the surface area of said semiconductor substrate;
   a charge-sensing buried channel region of the first conductivity type formed in part of the surface area of said well region, part of the well region which lies under said channel region being set in substantially the depletion state;
   at least one gate electrode formed on said charge-sensing buried channel region via a gate insulation film; and
   source and drain regions of the second conductivity type disposed on both sides of said charge-sensing buried channel region in a width direction thereof.

2. An output sensor of a charge transfer device according to claim 1, wherein said charge-sensing buried channel region is formed continuously with a charge-transfer buried channel region buried in said well region.

3. An output sensor of a charge transfer device according to claim 1, wherein said charge-sensing buried channel region is formed to have a buried current channel of the second conductivity type formed in the surface area thereof.

4. An output sensor of a charge transfer device according to claim 1, wherein said gate is formed in the form of a single layer and is biased to a preset potential at the time of output sensing operation.

5. An output sensor of a charge transfer device according to claim 1, wherein said gate electrode is formed of a laminated structure of a floating gate electrode and a control gate electrode.

6. An output sensor of a charge transfer device comprising:
   a semiconductor substrate of a first conductivity type;
   a well region of a second conductivity type having a low impurity concentration and formed in the surface area of said semiconductor substrate;
   a charge-sensing buried channel region of the first conductivity type formed in part of the surface area of said well region, part of the well region which lies under said channel region being set in substantially the depletion state;
   at least one gate electrode formed on said charge-sensing buried channel region via a gate insulation film;
   source and drain regions of the second conductivity type disposed on both sides of said charge-sensing buried channel region in a width direction thereof; and
   a switching element connected to said gate electrode, for applying a DC potential to said gate electrode, said switching element being turned off when the output of the charge transfer device is detected.

7. An output sensor of a charge transfer device comprising:
   a semiconductor substrate of a first conductivity type;
   a well region of a second conductivity type having a low impurity concentration and formed in the surface area of said semiconductor substrate;
   a charge-sensing buried channel region of the first conductivity type formed in part of the surface area of said well region, part of the well region which lies under said channel region being set in substantially the depletion state;
   a floating gate electrode and a control gate electrode, both formed on said charge-sensing buried channel region via a gate insulation film; and
   source and drain regions of the second conductivity type disposed on both sides of said charge-sensing buried channel region in a width direction thereof.

* * * * *